United States Patent [19]

Jelks

[11] 4,194,171

[45] Mar. 18, 1980

[54] ZINC OXIDE ON SILICON DEVICE FOR PARALLEL IN, SERIAL OUT, DISCRETE FOURIER TRANSFORM

[75] Inventor: Edward C. Jelks, San Diego, Calif.

[73] Assignee: The United States of America as represented by the Secretary of the Navy, Washington, D.C.

[21] Appl. No.: 922,610

[22] Filed: Jul. 7, 1978

[51] Int. Cl.² ............................................. H03H 7/30
[52] U.S. Cl. .................................. 333/149; 333/154;
310/313
[58] Field of Search ............... 333/140, 147, 149, 150, 333/154; 310/313; 331/107 A; 357/26; 364/821; 357/10, 71

[56] References Cited

U.S. PATENT DOCUMENTS

3,982,113    9/1976    Coldren .............................. 333/150

Primary Examiner—Alfred E. Smith
Assistant Examiner—Robert E. Wise
Attorney, Agent, or Firm—Richard S. Sciascia; Ervin F. Johnston; John Stan

[57] ABSTRACT

A material suitable for the propagation of acoustic waves on its surface comprises a substrate of semiconductor material, of which there exists an oxide, excluding the class of piezoelectric materials, the substrate having at least one flat surface. A layer of thermally grown oxide of the semiconductor material, is disposed on the flat surface. A film of titanium, approximately 300 angstroms thick, is disposed on at least a part of the layer of oxide. A layer of vacuum-deposited metal is disposed on the film of titanium. A layer of a piezoelectrid vacuum-sputtered material is on the layer of vacuum-deposited metal and on the oxide. The semiconductor material may be silicon, the oxide may be silicon dioxide, the piezoelectric material may be zinc oxide, and the metal may be gold. The material further comprises an interdigitated electrode structure disposed upon the piezoelectric material, which, when an electrical signal is applied to it, can cause propagation of a surface acoustic wave (SAW) upon the surface of the piezoelectric material, the combination comprising a SAW transducer.

17 Claims, 20 Drawing Figures

SIDE VIEW OF CONVOLVER

TOP VIEW OF CONVOLVER.

FIG. 3.
TRIPLE-PRODUCT CONVOLVER, GENERALIZED EMBODIMENT

FIG. 1. (PRIOR ART)
A SIMPLE SURFACE ACOUSTIC WAVE (SAW) DEVICE.

FIG. 5A. SIDE VIEW OF CONVOLVER

FIG. 5B. TOP VIEW OF CONVOLVER.

FIG. 5.
TRIPLE PRODUCT CONVOLVER, IMPLEMENTED AS MOSFET AND SAW DEVICES.

FIG. 2. A USEFUL TRANSDUCER GEOMETRY FOR ZINC OXIDE ON SILICON DEVICES

FIG. 4. FOUR-TAP TRIPLE-PRODUCT CONVOLVER.

FIG. 11.
EQUIVALENT CIRCUIT OF CONVOLVER

NOTE:
$V_1, V_2, V_3$... SAMPLES OF INPUT WAVE FORM.

FIG. 12.
ALTERNATIVE EQUIVALENT CIRCUIT FOR CONVOLVER.

FIG. 6. MOS TAP STRUCTURE

FIG. 7. NONLINEAR COUPLING COEFFICIENT AS A FUNCTION OF SILICON SURFACE POTENTIAL FOR n-TYPE SILICON.

FIG. 8. SCHEMATIC OF ZnO SPUTTERING APPARATUS.

FIG. 9. X-RAY DIFFRACTION FROM ZnO ON GLASS WITH SUBSTRATE TEMPERATURE CONTROLLED AT 150° C.

FIG. 10. SCHEMATIC REPRESENTATION OF PHOTOLITHOGRAPHIC PROCESSES.

ZINC OXIDE ON SILICON DEVICE FOR PARALLEL IN, SERIAL OUT, DISCRETE FOURIER TRANSFORM

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

Modern signal processing systems call for a variety of complex operations, including correlating, matched filtering, and Fourier transforming. A number of different approaches have been successful in achieving these functions, one of which is a technology based on the propagation of high-frequency acoustic waves on the surface of piezoelectric crystals. The chief advantages of these surface acoustic wave (SAW) devices, compared with alternative technologies, are their simplicity, processing speed, and compactness. Already they have been incorporated into military communication systems, radars, and satellite systems.

Work is currently being done to extend SAW techniques to silicon integrated circuits, thus combining real-time analog processing with complex peripheral circuitry on a single small chip of silicon.

This invention relates to a device capable of executing a high-speed discrete Fourier transform of a signal for the situation in which the signal appears in a parallel format and is read out in a serial format. The device could be used for various signal processing functions, including beamforming, image data compression, etc.

Only one prior art experimental device exists that is capable of performing the above function, and it requires the use of a lithium niobate delay line and a transducer structure to which is bonded an array of diodes fabricated on a silicon-on-sapphire substrate. This prior art embodiment is discussed by Reeder, T. M. and Gilden, M., "Convolution and Correlation by Nonlinear Interaction in a Diode-coupled Tapped Delay Line," Applied Physics Letters, Vol. 22, No. 1, Jan. 1, 1973, p. 8. The prior art device described therein requires separate complicated linearization circuitry to implement a linear discrete Fourier transform.

Prior art which provides useful background information for both the material of this invention and the convolver implemented upon the material comprise the following: (1) Coldren, L. A., "Effect of bias field in a zinc-oxide-on-silicon acoustic convolver", Applied Physics Letters, Vol. 25, No. 9, Nov. 1, 1974, Pp 473-475; (2) Coldren, L. A., "Zinc oxide on silicon memory cells scanned by acoustic surface waves", Applied Physics Letters, Vol. 26, No. 4, Feb. 15, 1975, Pp 137-139; (3) Davis, J. L., "Properties of the MZOS Surface Wave Convolver Configuration N", IEEE Transactions on Electron Devices, Vol. ED-23, No. June 1976, Pp 554-559; and (4) Davis, K. L., "S. A. W. Frequency Synthesis Using a Monolithic ZnO-on-Si Convolver", Electronic Letters, Vol. 12, Sept. 16, 1976, Pp 487-488.

SUMMARY OF THE INVENTION

A material suitable for the propagation of acoustic waves on its surface comprises a substrate of semiconductor material of which there exists an oxide. The class of piezoelectric materials is excluded. The substrate has at least one flat surface. A layer of the oxide of the semiconductor material is disposed on the flat surface. A layer of metal is disposed on at least a part of the layer of oxide. A layer of piezoelectric material is disposed on the layer of metal and on the oxide. Typically, the semiconductor material may be silicon, the oxide may be silicon dioxide, and the piezoelectric material may be zinc oxide. The metal may be either aluminum or gold, as examples. An interdigitated electrode structure may be disposed upon the piezoelectric material. When an electrical signal is applied to the electrode structure a surface acoustic wave (SAW) is caused to propagate upon the surface of the piezoelectric material. The combination of material and electrode structure comprises a SAW transducer. The electrode structure comprises an input electrode structure and an output electrode structure, both so configured as to form a triple-product convolver.

OBJECTS OF THE INVENTION

An object of the invention is to provide a material having a non-piezoelectric surface, which nevertheless can propagate surface acoustic waves.

Another object of the invention is to provide such a material with an interdigitated electrode structure.

Yet another object of the invention is to provide an interdigitated electrode structure which is capable of convolving input signals.

A still further object of the invention is to provide a transducer which can perform a high-speed discrete Fourier transform of an input signal in parallel format and can be read out in a serial format.

These and other objects of the invention will become more readily apparent from the ensuing specification when taken together with the drawings.

DESCRIPTION OF THE PREFERRED EMBODIMENTS

Figures 1, 3, 5A:
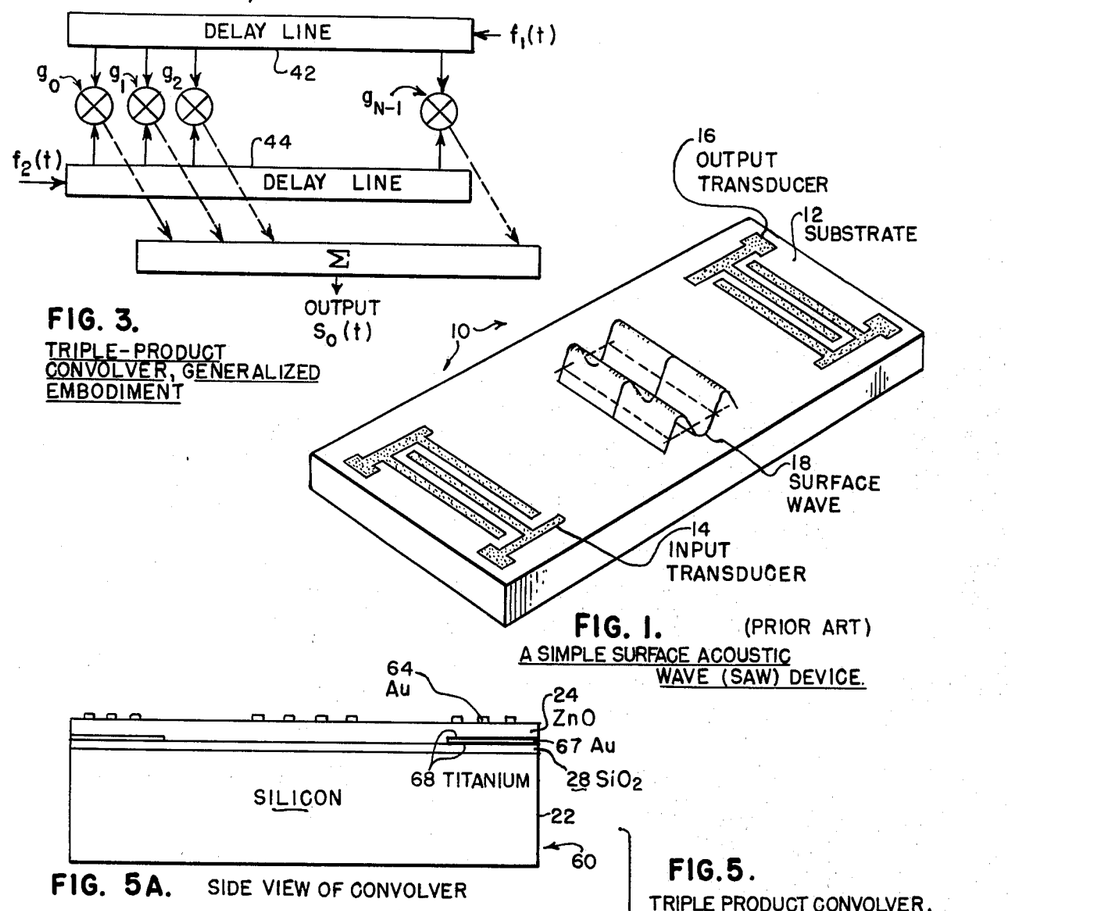
FIG. 1 is a diagram of a prior art simple surface acoustic wave (SAW) device.
FIG. 3 is a diagrammatic view of a generalized embodiment of a triple-product convolver.
FIGS. 5A and 5B are diagrammatic views of a convolver, similar to the convolver shown in FIG. 4, except that it is implemented as a MOSFET.

In typical SAW devices, 10 in FIG. 1, a high-frequency electrical signal is applied to a periodic metal pattern 14 and 16 deposited on the surface of a piezoelectric crystal 12. If the frequency of the electrical signal and the spacing of the metal patterns, 14 and 16, are adjusted so that their product equals the natural phase velocity of the crystal 12, a surface acoustic wave 18 will be generated and will propagate a long distance on the crystal with very little loss of amplitude. Since the energy in the wave 18 is confined to a region at the crystal surface, the wave may be tapped at any point in its path with another periodic metal pattern.

Figure 2:
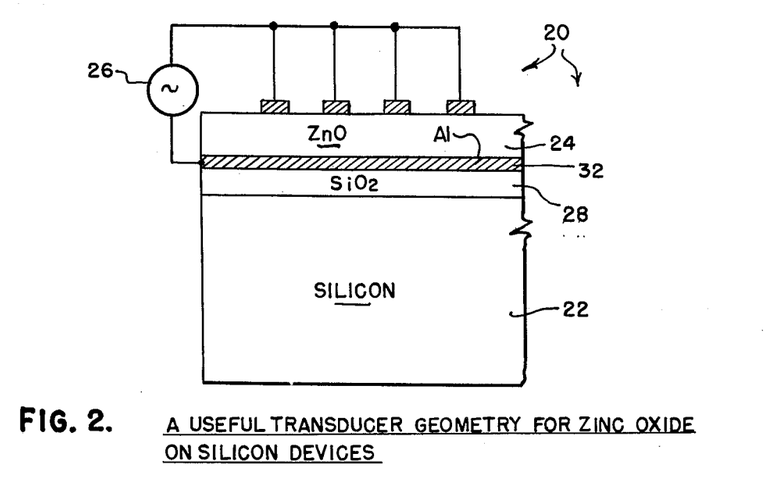
FIG. 2 is a diagrammatic view showing a useful transducer geometry for a zinc oxide on silicon device.

Reference is now directed to the transducer 20 shown in FIG. 2. Silicon does not have piezoelectric properties. To launch surface acoustic waves onto silicon 22, therefore, a thin layer of piezoelectric material, usually zinc oxide 24, is deposited on top of the silicon to mechanically couple the acoustic energy in the layer to the silicon. The electrical signal generated by signal source 26 can be efficiently converted into acoustic waves in the silicon 22 if the geometry and the electrical conditions in the piezoelectric layer 24 are carefully designed.

Surface acoustic wave transducers 28 have been built with several geometries, the most effective of which is shown in FIG. 2. In this case, the thermally grown silicon dioxide layer 28 is used to protect the silicon 22 surface from impurities and to electrically separate the silicon from the grounded metal plate 32 under the zinc oxide film 24. The aluminum ground plate 32 prevents electrical energy in the input signal from source 26, from being dissipated in the semiconducting silicon 22 instead of in the piezoelectric conversion process in the zinc oxide 24.

Transducer pairs of this sort have been built at 80 MHz with 24 dB insertion loss. Further work should decrease insertion losses to 10 dB.

The ability to propagate SAWs efficiently on silicon, in addition to the advantages gained from using integrated circuit technology, also expands the signal processing capability of SAW devices into areas not easily available to standard SAW technology. In particular, two SAWs can be easily multiplied or mixed on silicon and their product scaled by a third electrical signal—a triple product. Since this triple product can be distributed over the entire surface wave propagation path, programmable correlating, matched filtering, and Fourier transforming can be done. A generalized embodiment 40 is shown in FIG. 3. An object of the invention was to build a monolithic delay line device 40 that could form a product from three input signals in real time at various positions along the delay path. It can be seen that two of the input signals, $f_1(t)$ and $f_2(t)$, are oppositely propagating waves in the delay lines, 42 and 44, while the third input signal, $g_i$, scales the product of the two propagating waves at discrete positions along the propagating path.

The importance of such a device 40 lies in the fact that it can be used to perform several useful signal-processing functions, including electrically programmable correlation or convolution and real-time Fourier transforms where the input function $g_i$ is in a parallel format. In the case of the Fourier transform, the two oppositely propagating waves, $f_1$ and $f_2$, can be modulated with FM signals so that the distributed product along the delay path is a linear function of modulation frequency with distance. Thus the frequency of the resultant wave is a linear function of position. If the function to be transformed is now sampled at equal intervals and if each sample is used as the scaling signal at evenly spaced taps along the delay path, then the sum of the output products from all taps is $S_o(t)$, as shown in FIG. 3. A time-sampled version of this output signal is proportional to the discrete Fourier transform (DFT) of $g(x_i)$.

Figure 4:
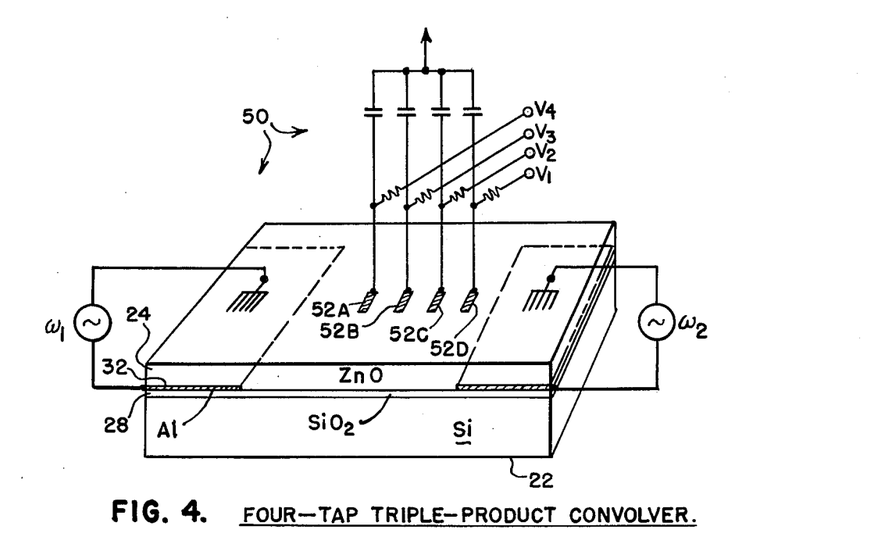
FIG. 4 is a view, partially schematic and partially diagrammatic, of a specific implementation of a four-tap triple-product convolver, using the geometry shown in FIG. 2.

A more specific device 50 has been built with a configuration similar to that shown in FIG. 4. The response of each of the center taps 52 can be electrically programmed by depleting the silicon 22 of free carriers at varying depths with a DC bias voltage, $V_1$, $V_2$, $V_3$ and $V_4$. Thus each tap 52 acts much like a bias-variable diode.

Figure 5B:
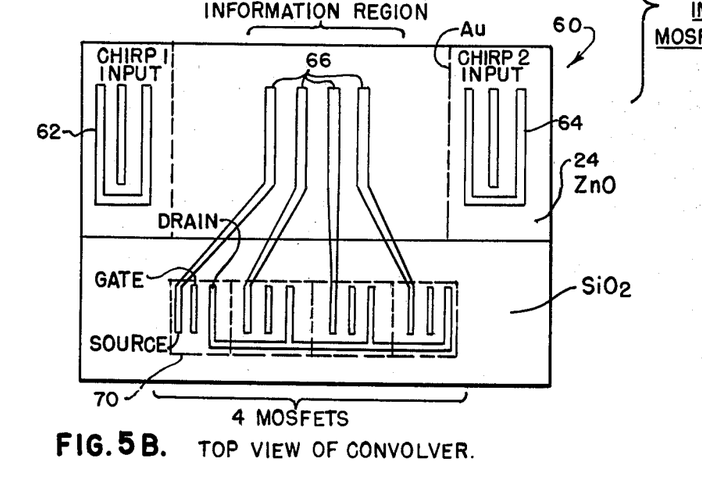

Before discussing the convolver 60 shown in FIG. 5, operation of the device can be better understood by first considering the definition of the discrete Fourier Transform (DFT):

$$G_m = \sum_{n=0}^{N-1} g_n e^{-j2\pi mn/N} \tag{1}$$

But $$2mn = \tfrac{1}{2}[(n+m)^2 - (n-m)^2], \tag{2}$$

so that $$G_m = \sum_{n=0}^{N-1} g_n e^{-j\frac{\pi}{2}(n+m)^2/N} e^{j\frac{\pi}{2}(n-m)^2/N} \tag{3}$$

In this form, then, the DFT components $G_m$ are given by the convolution of two chirps weighted by the samples $g_n$ of the function to be transformed.

A possible implementation of the above form of the DFT would consist of (a) modulating oppositely propagating surface acoustic waves (SAWs) of frequencies $w_1$ and $w_2$ with chirp waveforms; (b) detecting the overlapping and superimposed SAWs with an array of discrete taps; (c) performing a squaring operation at each tap; (d) linearly attenuating or amplifying the squared signal at each tap according to the sampled input waveform amplitudes; (e) summing the taps; and (f) extracting the sum or difference frequency component ($w_1 \pm w_2$) with a bandpass filter.

The device 60 shown in FIG. 5 is designed to perform the above operations in monolithic form. The SAWs are launched onto the SiO$_2$/Si surface with the gold and ZnO film transducer structures 62 and 64 at opposite ends of the device 60. This is possible since ZnO, 24, is a piezoelectric material. At each of the detecting taps 66 a depletion region is created with bias (not shown) applied to the tap. The SAWs propagate through the material 24 accompanied by electric fields exponentially decaying into the Si, 22, which upon entering the tap array 66 region, modulate the depletion width, and thereby cause a change in the Si, 22, surface potential. This change is approximately given by $$\Delta\phi = a\ \text{constant} \times [2E\Delta E + (\Delta E)^2] \tag{4}$$

where E is the electric field at the Si, 22, surface. Consequently $$\Delta V_G = \text{constant} \times [(\Delta E)^2 + \ldots,] \quad (5)$$

where $V_G$ is the bias voltage on a tap. The MOS capacitors in depletion thus perform the needed squaring operation at each tap.

The attenuation or amplification can be performed in a number of ways. One way that is simple for integration uses one MOSFET 70 at each tap 66 as a linear variable conductance, as shown in FIG. 5. These MOSFETs 70 are fabricated on the same chip as the taps 66, in an area free of the ZnO film 24, as shown in FIG. 5. The external chirp circuitry, not shown, is similar to that described by Reeder, T. M. and Swindal, J. L., "Variable Acoustic Surface Wave Correlator", United Aircraft Research Laboratories Report ECOM-73-0194-F, November 1974.

The above device 60 is also capable of performing a convolution or a correlation operation with properly applied input signals, thus the general designation of "monolithic triple product convolver" is appropriate.

Figures 6, 12:
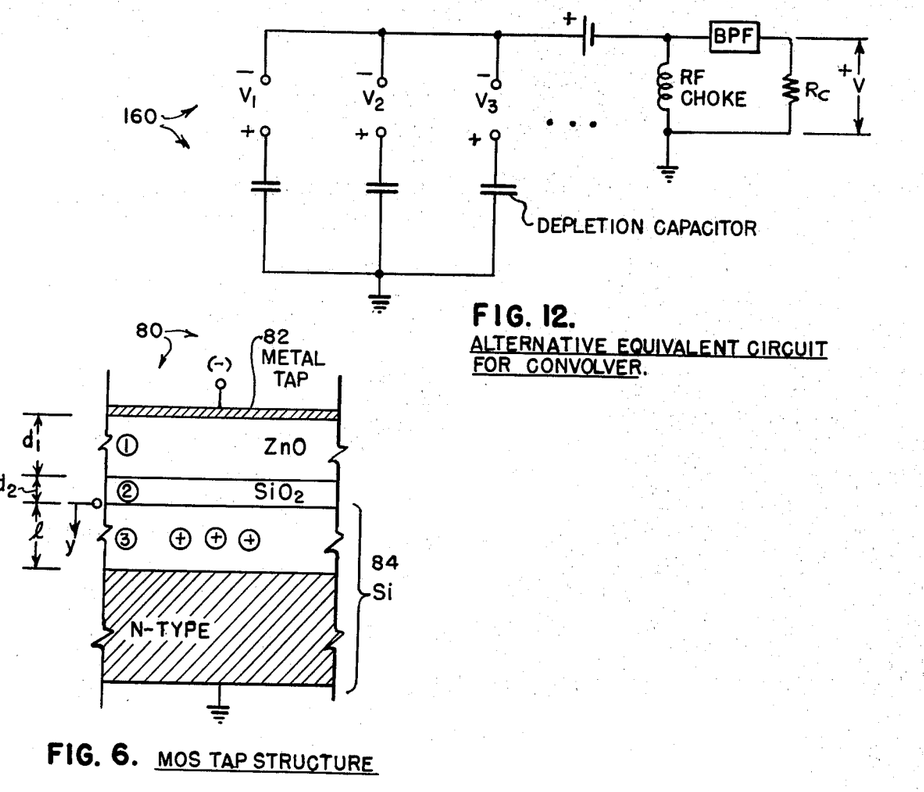
FIG. 6 is a diagram of the MOS tap structure.
FIG. 12 is a schematic diagram of an alternative equivalent circuit of the convolver.

To clarify the ideas behind the nonlinearity of a MOS capacitor tap, the structure 80 shown in FIG. 6 is instructive. When a negative bias is applied to the metal tap of the metal/oxide/n-type semiconductor sandwich, the free electrons contributed by the donor impurities are driven from the region of the semiconductor directly under the metal tap, leaving this region depleted of free carriers. This depleted region consists of a uniform distribution of uncovered immobile donor impurities, each having a positive charge. Poisson's equation with respect to the depleted region may be solved, and the potential at the surface of the silicon substrate 84.

Figure 7:
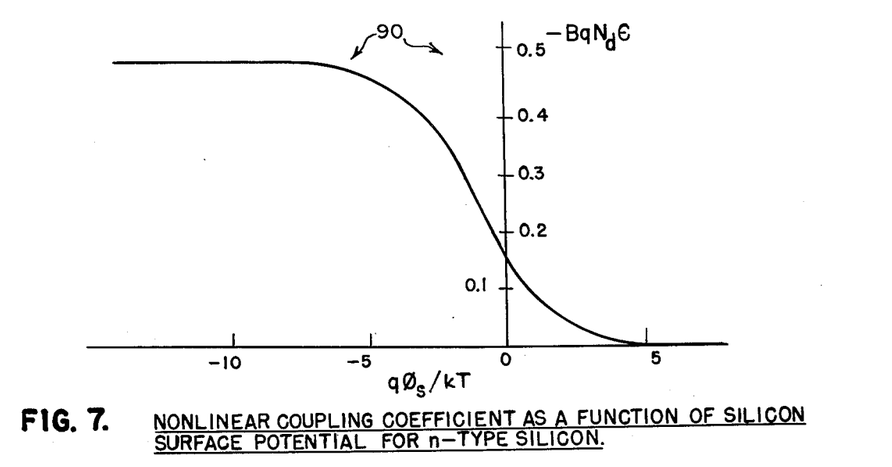
FIG. 7 is a graph showing the nonlinear coupling coefficient as a function of silicon surface potential for n-type silicon.

If the static electric field is perturbed by a time-varying electric field carried by a propagating piezoelectric surface wave, the resulting small signal potential may be obtained. Therefore, the silicon surface potential will have a major component proportional to the square of the electric field carried by the surface wave. A plot 90 of the theoretical variation of the second harmonic component as a function of bias voltage, based on a more detailed analysis, is shown in FIG. 7.

Regarding the manufacture of the convolver material, the first step in developing the triple-product convolver, 60 of FIG. 4, was to learn how to grow thin piezoelectrically active films for coupling acoustic energy into the silicon substrate 22. Zinc oxide (ZnO), 24, was chosen as the piezoelectric film because of its large piezoelectric coupling factor and because such films already had been grown successfully by a few laboratories for SAW applications. For example, see the article by Hickernell, F. S., and Brewer, J. W., "Surface-elastic-wave properties of dc-triode-sputtered zinc oxide films," Appl. Phys. Lett., vol. 21, no. 8, 389 (1972). These films are usually RF sputtered. Since most RF sputtering systems are unique and since RF sputtering is largely an empirical technique, an experimental program was embarked upon to develop a repeatable ZnO process for the existing system being used.

Figure 8:
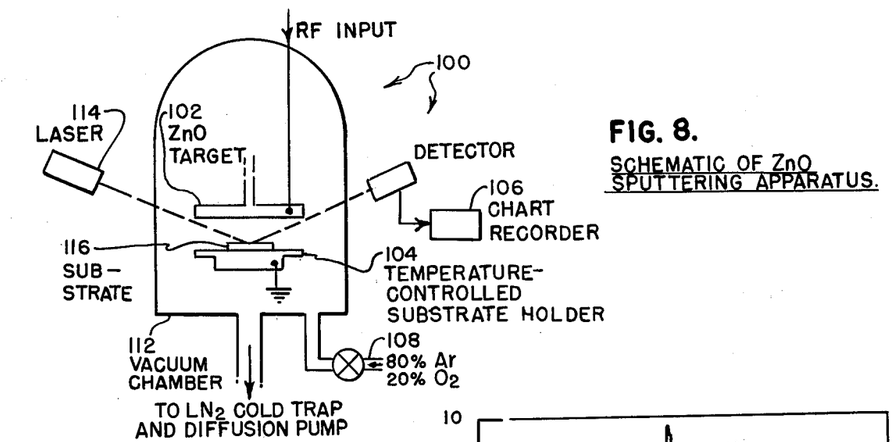
FIG. 8 is a diagram of a zinc oxide (ZnO) sputtering apparatus.

Referring now to FIG. 8, the major modifications to the system 100 were the installation of a high-purity ZnO target 102, the construction and installation of a temperature controlled substrate holder, 104, the installation of a laser film thickness monitor 106, and the addition of an 80-percent argon/20-percent oxygen mixture 108 for the sputtering atmosphere. The substrate holder 104 was designed to be vacuum tight to prevent outgassing of the heater (not shown) into the vacuum chamber 112. The thickness monitor 106 was based on the idea of continuously observing the reflection of a laser 114 from the transparent ZnO film which forms on top of substrate 116, and noting where the interference nulls occurred as a function of time. If it is assumed that the film deposition is linear with time, a trial film deposition run allows calibration of the laser output record in angstroms per interference fringe.

To launch surface acoustic waves efficiently onto a layered structure consisting of a piezoelectric film on a nonpiezoelectric substrate, it is necessary for the major piezoelectric axis of the film to be in a direction normal to the substrate. Since ZnO films have isotropic piezoelectric properties in a plane normal to the main piezoelectric axis, or Z axis, only polycrystalline films need be grown as long as the Z axes of the crystallites are vertical. Previous experiments by workers in the field have shown that ZnO films tend to orient with the Z axis in the direction of the incident atoms, if the deposition rate is low enough and the substrate hot enough to allow sufficient molecular mobility on the substrate after condensation. At temperatures in excess of 300° C. and deposition rates around 200 angstroms per hour, the films can become epitaxial. This is discussed by Rozgonyi, G. A., and Polito, W. J., "Epitaxial thin films of ZnO on CdS and Sapphire", J. Vac. Sci. Tech., vol. 6, no. 1, 115 (1969).

The first film deposition runs were made using glass microscope slides as substrates and adjusting the system parameters approximately to those used by Khuri-Yakub, B. T., Kino, G. S., and Galle, P., "Studies of the optimum conditions for growth of rf-sputtered ZnO films", J. Appl. Phys., vol. 46, no. 8, 3266 (1975). Checks on film orientation were made initially with the use of an X-ray diffraction system; the Z axis orientation was judged according to the relative magnitudes of the reflections from the three principal planes. It was found that for substrate temperatures in excess of approximately 120° C., X-ray reflections from the (101) and (100) planes were indiscernable in the noise with a deposition rate of 150 angstroms per min.

Figure 9:
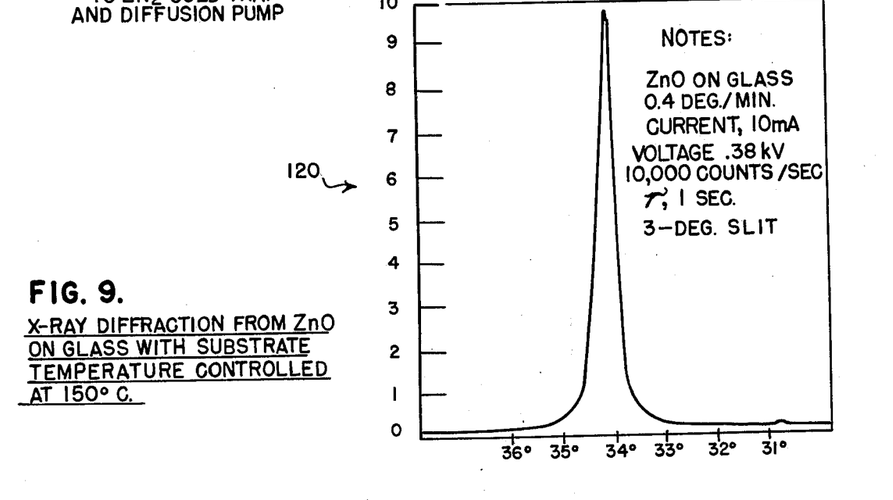
FIG. 9 is a graph showing the X-ray diffraction from ZnO on glass with substrate temperature controlled at 150° C.
Figure 10A:
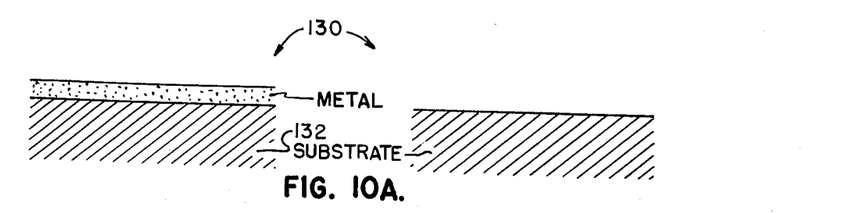
FIGS. 10A–10E provide a schematic representation of the photolithographic processes used to make the material of this invention.
Figure 10B:
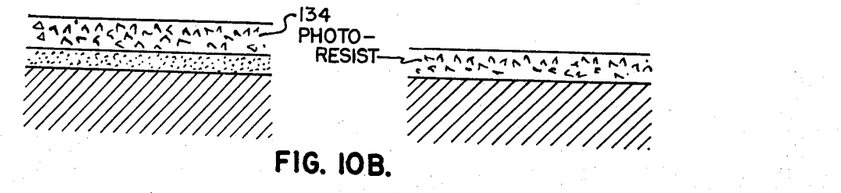
Figure 10C:
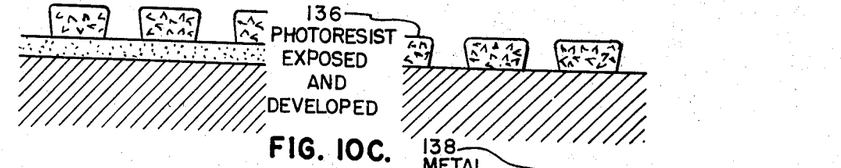
Figure 10D:
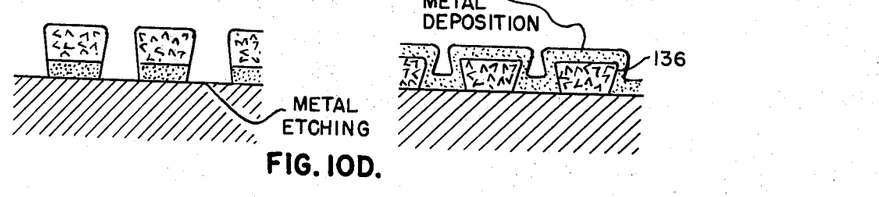
Figure 10E:
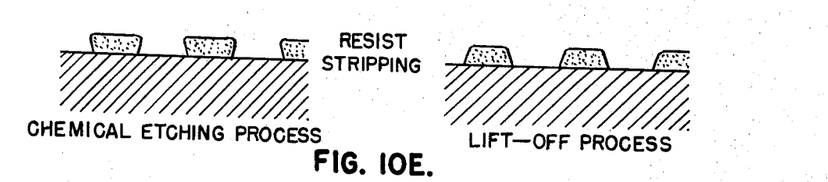

FIG. 9 shows a graph 120 of X-ray data from a well oriented film of Zn) on glass. The reflections from the (101) plane at 36.5° and the (100) plane at 31.5° are absent. Similar experiments were carried out on gold, titanium, aluminum, and $SiO_2$.

Reference is directed back to FIG. 5A. Adherence to the gold 66 was a problem because of the inability of gold to form good chemical bonds with the ZnO, 24; however, a 200-angstrom top layer of titanium 68 between the gold substrate 66 and the ZnO film 24 cured the problem, with the additional advantage of less ZnO film surface roughness. It was found that well oriented films of ZnO could be grown on all the substrates, with a deposition rate of 150 angstroms per minute and a substrate temperature of 200° C.

The bottom layer of titanium, also designated 68, was generally necessary if gold 66 were used as a layer on the silicon dioxide 28, to provide better adhesion, through an alloying action but would not generally be necessary for aluminum.

Standard integrated-circuit photolithographic techniques normally are not suitable for fabricating devices with ZnO on silicon, since the etching required to delineate metal pattern in most cases affects the ZnO. Consequently, a photolithographic technique without etching had to be developed in the laboratory. The process chosen was patterned after one called "lift-off" which is used by some surface-wave and integrated-optics laboratories. For example, see Smith, H. I., Bachner, F. J., and Etremow, N., "A High-Yield Photolithographic Technique for Surface Wave Devices", J. Electrochem. Soc., Vol. 118, No. 5, 821 (1971).

The basic process sequency 130 is pictured in FIG. 10, with the left column showing older methods and the right column showing the newer method. It consists of (1), FIG. 10B, spinning a layer of positive photoresist 134 onto the substrate 132; (2), FIG. 10C, exposing the photoresist 136 with ultraviolet light through a prepared photographic mask; (3), FIG. 10C, developing, or removing, the regions exposed to the light; (4), FIG. 10D, depositing a thin layer of metal 138 over the developed photoresist pattern; and (5) FIG. 10E, "lifting-off" the metal 138 lying directly on the photoresist regions 136 by removing the photoresist with a solvent.

Success of this technique depends basically on two factors: vertical or undercut photoresist edges after developing and good adhesion of the metal film 138 to the areas of the substrate 132 where the photoresist 134 has been removed. A large number of trials were run on glass and ZnO using gold, titanium, and aluminum metallization to establish the best parameters for use with the laboratory system and the best chemical procedure.

The key elements to success with "lift-off" photolithography were found to be (1) a thorough cleaning of the substrates 132 in inorganic solvents when possible and boiling in a detergent solution followed by boiling in deionized water; (2) intimate contact between substrate and mask during exposure, achieved by using vacuum pulldown on the mask and evidenced by visible optical interference fringes at the interface; (3) exposure times in excess of 200 seconds to enhance undercutting; (4) the use of a 300-angstrom titanium film between the substrate and metallization to assure good adhesion; and (5) pressures less than $5 \times 10^{-8}$ torr in the vacuum chamber before metal deposition to thoroughly out-gas regions of the substrate 132 where photoresist 134 was removed.

A summary of the lift-off photolithographic procedure follows:

1. Clean substrate by swabbing with lab soap (Liquinox), rinsing in deionized water, and boiling in deionized water.
2. Bake-out slides for 1 hour.
3. Let substrate cool to room temperature.
4. Flood substrate with filtered AZ 1350 B photoresist.
5. Spin at 3000 rpm for 30 seconds.
6. Bake-out at 90° C. for 25 minutes.
7. Cool for 10 minutes to room temperature.
8. Expose through mask using vacuum pulldown for 220 seconds (11-inch mask-to-light separation).
9. Develop for 35 seconds in MF-312 developer, 1:1 with deionized water at room temperature.
10. Rinse for 1 minute in deionized water.
11. Deposit 300 angstroms of Ti and about 1000 angstroms of other metal on photoresist pattern. Ultimate vacuum should be around $5 \times 10^{-8}$ torr.
12. Lift-off with 50° C. acetone accompanied by light swabbing with a cotton swab. Acetone may be decanted to eliminate large pieces of metal initially lifted off.
13. Rinse in deionized water.

To achieve adequate piezoelectric coupling to thin ZnO films, carrier frequencies in excess of 60 megahertz are required for the ZnO-on-silicon devices, which in turn requires high-resolution contact masks for device fabrication. The very small pattern dimensions rule out hand-prepared rubylith masters. Consequently, computer-generated masks had to be developed using Gerber plotting facilities.

A general computer program was written to calculate automatically the mask coordinates of a variety of different kinds of SAW device geometries by entering the appropriate parameters into the program. The punched-card output from this program is used as input to the Gerber plotter, which photographically reproduces SAW device geometry onto a large sheet of film that serves as a master mask. This mask is photographically reduced by a factor of ten onto a high resolution photographic plate in a surface wave laboratory. The photoresist film in the substrate is directly exposed through the light and dark pattern on the plate as explained hereinabove.

Figure 11:
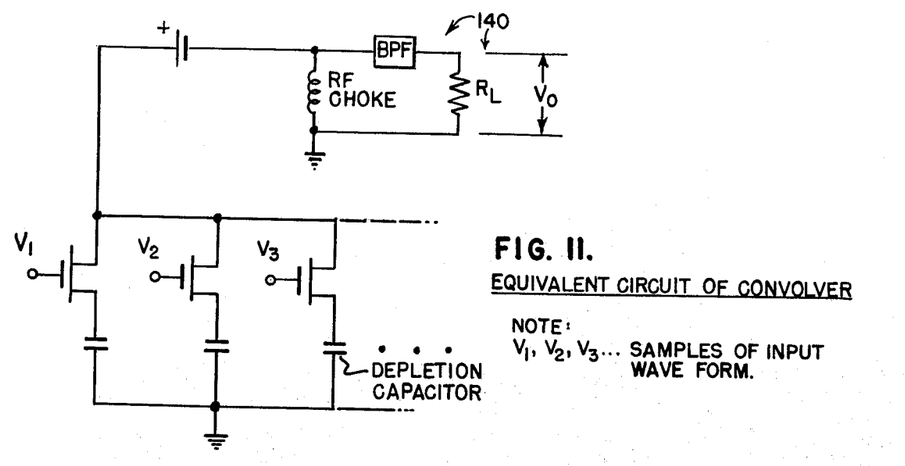
FIG. 11 is a schematic diagram of the equivalent circuit of the convolver.

FIG. 11 is a schematic diagram of a convolver 140 which is electronically equivalent to the convolver 60 shown in FIG. 5. Another way of implementing the device 60 with a more limited linear dynamic range is to accomplish the attenuating operation by varying the DC potentials on the taps. This implementation 160 with connecting circuitry is shown in FIG. 12.

The primary advantages of the device 60 of FIG. 5 over previously built devices are (a) that a completely monolithic structure is used and (b) that no complicated linearizing circuits are needed. A major new feature is that an entirely different physical effect that is compatible with integrated circuit processing is used to generate the squaring operation.

Obviously, many modifications and variations of the present invention are possible in the light of the above teachings, and, it is therefore understood that within the scope of the disclosed inventive concept, the invention may be practiced otherwise than as specifically described.

What is claimed is:

1. A device suitable for the propagation of acoustic waves on its surface comprising:
   a substrate of semiconductor material, of which there exists an oxide, excluding the class of piezoelectric materials, the substrate having at least one flat, rectangular, surface, the longer side defining two ends;
   a layer of oxide of the semiconductor material, disposed on the flat surface;
   a layer of metal disposed on at least a part of the layer of oxide, at both ends thereof;
   a layer of a piezoelectric material disposed on the layer of metal and on that part of the oxide over and between the metal; and
   at least one metal-oxide semiconductor (MOS) structure disposed on that part of the oxide which is not covered by the layer of piezoelectric material.

2. The device according to claim 1, wherein:
   the semiconductor material is silicon;
   the oxide is silicon dioxide; and
   the piezoelectric material is zinc oxide.

3. The material according to claim 2, wherein:
   the metal is aluminum.

4. The device according to claim 3, further comprising:
   an interdigitated electrode structure disposed upon the piezoelectric material, which, when an electrical signal is applied to it, can cause propagation of a surface acoustic wave (SAW) upon the surface of the piezoelectric material, the combination comprising a SAW transducer.

5. The SAW transducer according to claim 4, wherein the electrode structure comprises:
   an input interdigitated structure, to which the electrical signal may be applied, the structure being disposed over, but not in contact with, the layer of metal; and
   an output interdigitated structure, which intercepts the surface acoustic wave generated by the input structure and transduces it back into an electrical signal.

6. The transducer according to claim 5, wherein:
   the input electrode structure comprises two structures, one at each end, with all electrodes being parallel, any electrical signals to be applied being applied between each structure and the metal layer below it.

7. The transducer according to claim 6 wherein:
   the output electrode structure is disposed between the two input electrode structures, its electrodes being parallel to the other electrodes.

8. The transducer according to claim 7, wherein:
   the output electrode structure comprises four sets of electrodes; and
   the MOS structures comprise four separate MOS devices, each having their gate connected to an output structure.

9. A material suitable for the propagation of acoustic waves on its surface comprising:
   a substrate of semiconductor material, of which there exists an oxide, excluding the class of piezoelectric materials, the substrate having at least one flat surface;
   a layer of thermally grown oxide of the semiconductor material, on the flat surface;
   a film of titanium, approximately 300 angstroms thick, disposed on at least a part of the layer of oxide;
   a layer of vacuum-deposited metal disposed on the film of titanium;
   a layer of a piezoelectric vacuum-sputtered material on the layer of vacuum-deposited metal and on the oxide.

10. The material according to claim 9, wherein:
    the semiconductor material is silicon;
    the oxide is silicon dioxide; and
    the piezoelectric material is zinc oxide.

11. The material according to claim 10, wherein:
    the metal is gold.

12. The material according to claim 11, further comprising:
    an interdigitated electrode structure disposed upon the piezoelectric material, which, when an electrical signal is applied to it, can cause propagation of a surface acoustic wave (SAW) upon the surface of the piezoelectric material, the combination comprising a SAW transducer.

13. The SAW transducer according to claim 12, wherein the electrode structure comprises:
    an input interdigitated structure, to which the electrical signal may be applied, the structure being disposed over, but not in contact with, the layer of metal;
    an output interdigitated structure, which intercepts the surface acoustic wave generated by the input structure and transduces it back into an electrical signal.

14. The transducer according to claim 13, wherein:
    the substrate is rectangular in shape, defining two ends at the long side;
    the layer of metal is disposed at each end, the metal serving as a ground for the applied electrical signal;
    the input electrode structure comprises two structures, one at each end, with all electrodes being parallel, any electrical signals to be applied being applied between each structure and the metal layer below it.

15. The transducer according to claim 14 wherein:
    the output electrode structure is disposed between the two input electrode structures, its electrodes being parallel to the other electrodes.

16. The transducer according to claim 15 wherein:
    the output electrode structure comprises four sets of electrodes.

17. The transducer according to claim 16, further comprising:
    four capacitors, having two terminals, each having one terminal connected to an output electrode, the other terminals being connected together.

* * * * *